United States Patent [19]
Lopatin

[11] Patent Number: 6,144,096
[45] Date of Patent: *Nov. 7, 2000

[54] LOW RESISTIVITY SEMICONDUCTOR BARRIER LAYERS AND MANUFACTURING METHOD THEREFOR

[75] Inventor: Sergey D. Lopatin, Santa Clara, Calif.

[73] Assignee: Advanced Micro Devices, Inc., Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/166,617

[22] Filed: Oct. 5, 1998

[51] Int. Cl.$^7$ ..................................... H01L 24/48
[52] U.S. Cl. ............ 257/751; 257/753; 257/773; 257/761; 257/737
[58] Field of Search .................. 257/751, 753, 257/773, 761, 763, 769, 737, 738

[56] References Cited

U.S. PATENT DOCUMENTS

| | | | |
|---|---|---|---|
| 5,094,981 | 3/1992 | Chung et al. | 437/190 |
| 5,134,460 | 7/1992 | Brady et al. | 257/737 |
| 5,623,166 | 4/1997 | Olowolafe et al. | 257/753 |
| 5,695,810 | 12/1997 | Dubin et al. | 427/96 |
| 5,858,868 | 1/1999 | Hirade | 438/597 |

*Primary Examiner*—Leo P. Picard
*Assistant Examiner*—Hung Van Duong
*Attorney, Agent, or Firm*—Mikio Ishimaru

[57] ABSTRACT

A semiconductor, and manufacturing method therefor, is provided with a barrier/adhesion layer, having cobalt, nickel, or palladium for semiconductors having conductive materials of copper, silver or gold. The barrier/adhesion layer can be alloyed with between about 0.2% and 4% tantalum, molybdenum, or tungsten to increase barrier effectiveness and lower resistivity.

14 Claims, 2 Drawing Sheets

LOW RESISTIVITY SEMICONDUCTOR BARRIER LAYERS AND MANUFACTURING METHOD THEREFOR

TECHNICAL FIELD

The present invention relates generally to semiconductors and more specifically to barrier materials used in semiconductor processing.

BACKGROUND ART

In the manufacture of integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

In one connection process, which is called a "dual damascene" technique, two channels of conductive materials, are positioned in vertically separated planes perpendicular to each other and interconnected by a vertical "via" at their closest point.

The first channel part of the dual damascene process starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and an optional thin adhesion layer is deposited to coat the walls of the first channel opening to ensure good adhesion and electrical contact of subsequent layers to the underlying semiconductor devices. A barrier layer is then deposited on the adhesion layer improve the formation of subsequently deposited conductive material and to act as a barrier material to prevent diffusion of such conductive material into the oxide layer and the semiconductor devices. A first conductive material is then deposited and subjected to a chemical-mechanical polishing process which removes the first conductive material above the first channel oxide layer and damascenes the first conductive material in the first channel openings to form the first channels.

The via formation step of the dual damascene process starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. An adhesion layer is then deposited to coat the via openings and the second channel openings.

Next, a barrier layer is deposited on the adhesion layer. This is followed by a deposition of the second conductive material in the second channel openings and the via openings to form the second channel and the via. A second chemical mechanical polishing process leaves the two vertically separated, horizontally perpendicular channels connected by cylindrical vias.

The use of the dual damascene technique eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), or titanium nitride (TiN) are used as barrier materials for copper. A thin adhesion layer formed of an adhesion material, such as titanium, is first deposited on the dielectrics or vias to ensure good adhesion and good electrical contact of subsequently deposited "barrier" (also called "seed") layers to underlying doped regions and/or conductive channels. Adhesion/barrier layer stacks formed of adhesion/barrier materials such as tantalum/tantalum nitride (Ta/TaN) and titanium/titanium nitride (Ti/TiN) have been found to be useful as adhesion/barrier material combination for copper interconnects.

The "barrier effectiveness" of a barrier layer with respect to a conductive material is its ability to prevent diffusion of the conductive material. The barrier effectiveness of a barrier layer is determined in part by its thickness, including the thickness uniformity, and its quality, including the number and sizes of defects such as pinholes which form on deposition. To resist copper diffusion, it is found that a minimum barrier layer thickness of 5 nm is currently required with the currents currently in use. However, to minimize the electrical resistance due to the barrier layer, it is desirable to maintain a thin barrier layer. Therefore, it is also currently desirable to keep the barrier layer thickness close to about 5 nm.

However, as semiconductors shrink in size, the barrier layer thickness must also shrink. A solution, which would permit thinner barrier layers with a reduction in the electrical resistance of the barrier layers without a decrease in their barrier effectiveness has long been sought, but has eluded those skilled in the art. As the semiconductor industry is moving from aluminum to copper and other type of materials with greater electrical conductivity and diffusiveness through dielectrics, it is becoming more pressing that a solution be found.

DISCLOSURE OF THE INVENTION

The present invention provides a semiconductor with a barrier layer, having a Group VIII B element combined with a Group V B or VI B element, which has increased barrier effectiveness and lower resistivity.

The present invention provides a semiconductor with a barrier layer, having a Group VIII B element alloyed with a small amount of a group V B or VI B element for semiconductors having conductive materials in Group I B, which has increased barrier effectiveness and lower resistivity.

The present invention provides a semiconductor with an barrier layer, having a substantially pure Group VIII B adhesion layer for a Group VIII B element alloyed with a small amount of a Group V B or VI B element for semiconductors having conductive materials in Group I B, which has increased barrier effectiveness and lower resistivity.

The present invention provides a semiconductor with a barrier layer, having cobalt (Co), nickel (Ni), or palladium (Pd) alloyed with tantalum (Ta), molybdenum (Mo), or tungsten (W), which has increased barrier effectiveness and lower resistivity.

The present invention provides a semiconductor with a barrier layer, having cobalt (Co), nickel (Ni), or palladium (Pd) alloyed with between about 0.2% and 4% tantalum (Ta), molybdenum (Mo), or tungsten (W) for semiconductors having conductive materials of copper (Cu), silver (Ag), or gold (Au), which has increased barrier effectiveness and lower resistivity.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
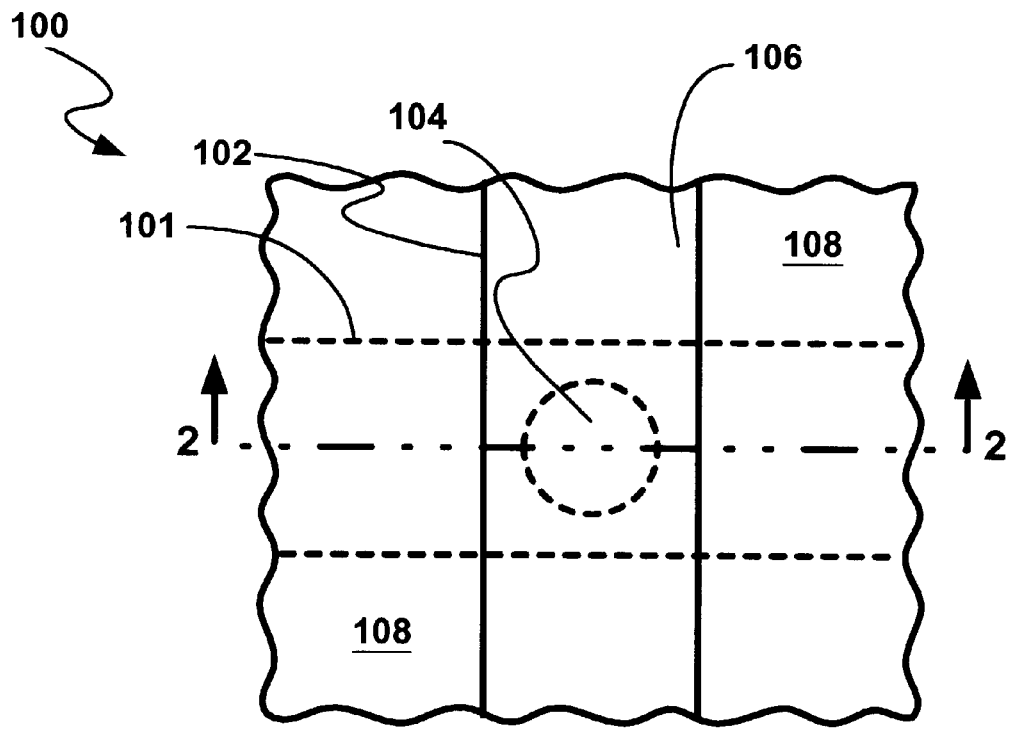
FIG. 1 is a plan view of aligned channels with a connecting via.

Referring now to FIG. 1, therein is shown a plan view of a pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel 101 comprises a first conductive material. The second channel 102 is formed by filling a second channel opening 106 disposed in a second channel oxide layer 108 with a second conductive material.

Figure 2:
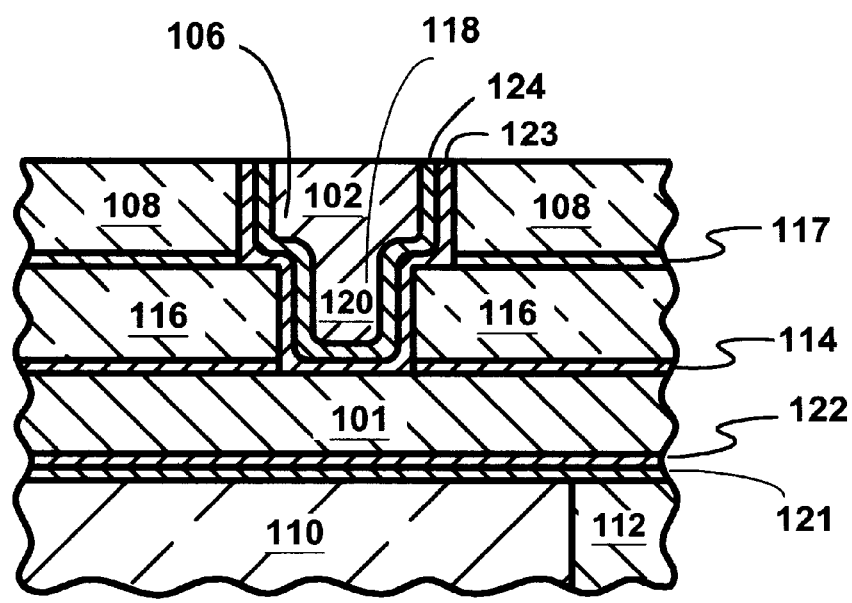
FIG. 2 is a cross-section of FIG. 1 along line 2—2.

Referring now to FIG. 2, therein is shown a cross-section of FIG. 1 along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1 defines a cylindrical via 120 when it is filled with the second conductive material.

Also shown disposed around the first channel 101 are an optional adhesion layer 121 and a barrier layer 122, and around the second channel 102 and the cylindrical via 120 is an optional adhesion layer 123 and a barrier layer 124. The barrier layers 122 and 124 are used to prevent diffusion of the conductive materials into the adjacent areas of the semiconductor. Titanium nitride and tantalum nitride are examples of barrier materials which have been used in the past for copper channels.

Figure 3:
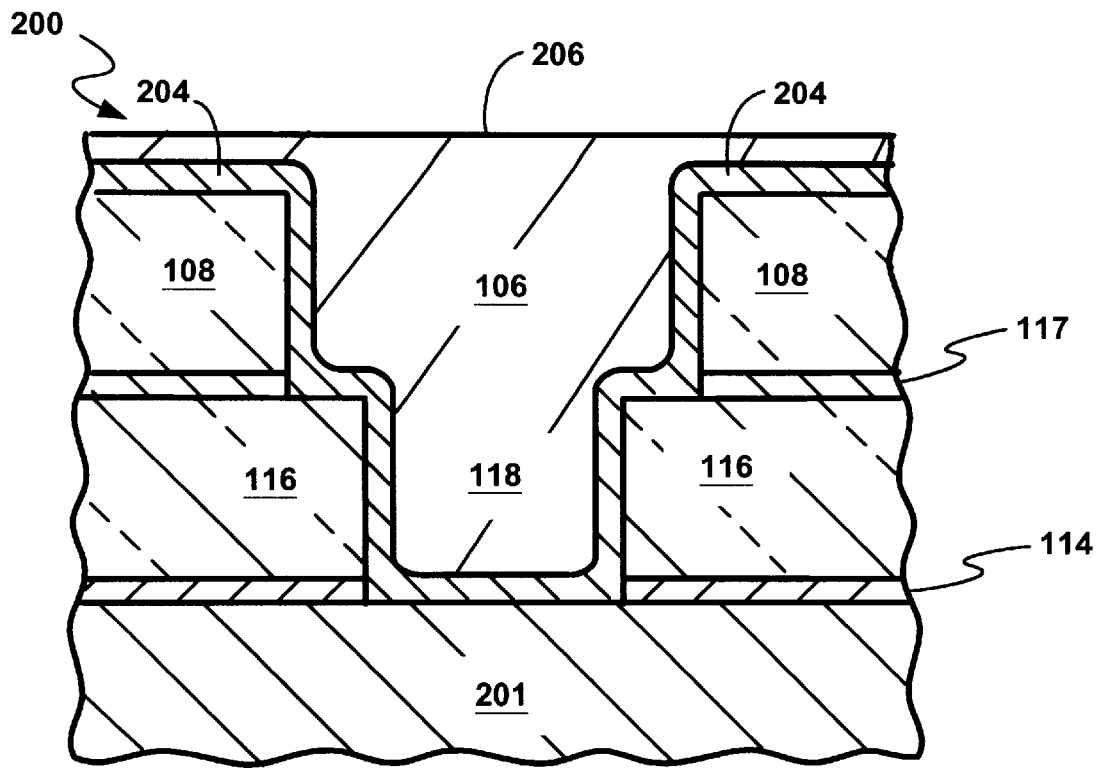
FIG. 3 is a close-up cross-section of FIG. 2 after deposition of barrier and conductive materials in the second channel opening in one mode of the present invention.

Referring now to FIG. 3, therein is shown the close-up cross-section of the semiconductor wafer 100 along the line 2—2 of FIG. 1 for one mode of the present invention. For convenience of illustration, like reference numerals are used in FIG. 3 to denote like elements already described in FIG. 2. The conductive material 202 is shown which is deposited in the first channel 101 (shown in FIG. 2). FIG. 3 shows the barrier material 204 after the deposition of the barrier layer 124 and the filling of the second channel opening 106 and via opening 118 with conductive material 206. While the same structure is applicable for all channels and vias, it is being shown for the second channel to simplify illustration.

Figure 4:
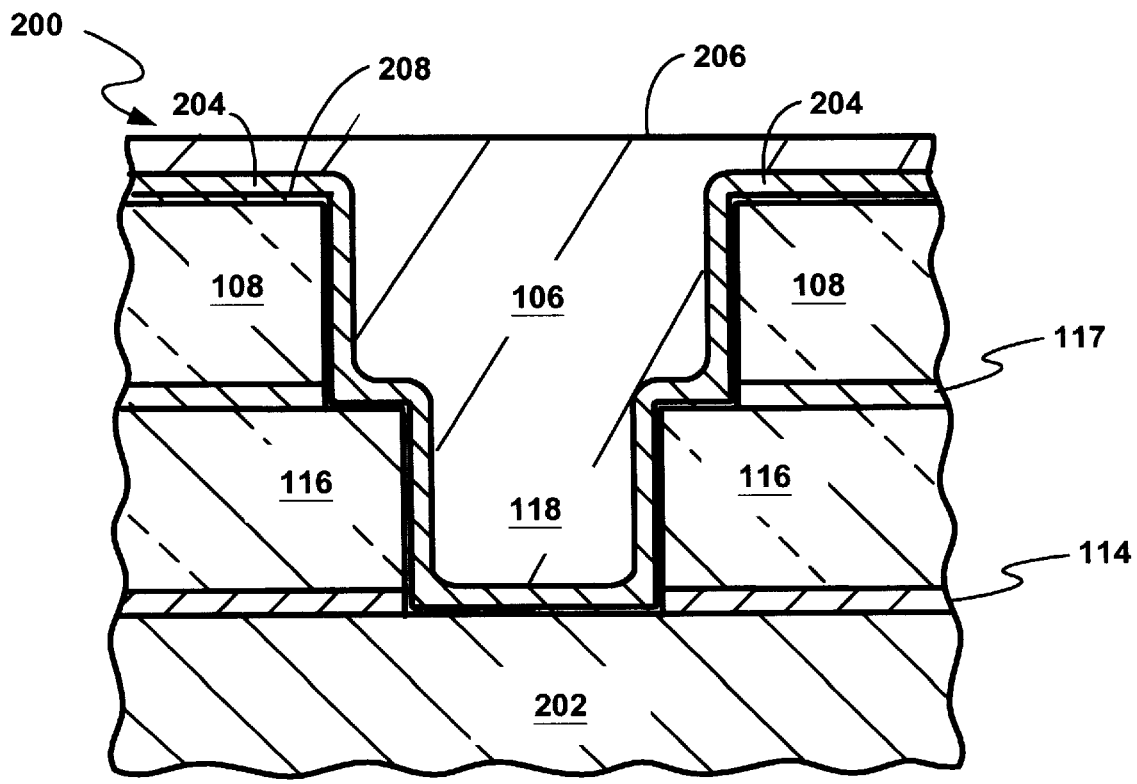
FIG. 4 is a close-up cross-section of FIG. 2 after deposition of adhesion, barrier, and conductive materials in the second channel opening in another mode of the present invention.

Referring now to FIG. 4, therein is shown the close-up cross-section of the semiconductor wafer 100 for another mode of the present invention. For convenience of illustration, like reference numerals are used in FIG. 4 to denote like elements already described in FIG. 2 and FIG. 3. An adhesion material 208 is shown deposited prior to the deposition of the barrier material 204.

In production, the first channel 101 in a first channel oxide layer (not shown) above portions of a semiconductor device (not shown) is put down using a conventional first damascene process over a production semiconductor wafer 100. The damascene process is a photolithographic process which uses a mask to define a first channel opening (not shown) in the first channel oxide layer. The first channel opening is then filled with the optional adhesion, barrier, and conductive material. The stop nitride layer 114, the via oxide layer 116, and the via nitride layer 117 would be successively deposited on top of the first channel 201 and the first channel oxide layer using conventional deposition techniques.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the second channel 106 to be perpendicular to the first channel 201.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 2 than in the horizontal direction. The nitride etch of the stop nitride layer 114 exposes a portion of the first channel conductive material 202 and completes the etching steps.

Thereafter, the thin barrier layer 204 is deposited on the second channel oxide layer 108 and the via oxide layer 116 in the second channel opening 106 and the cylindrical via opening 118. For conductive materials in Group I B, it has been determined that a Group VIII B element alloyed with one or more Group V B or VI B elements, will increase barrier effectiveness and lower resistivity compared to the conventional tantalum nitride or titanium nitride barrier materials.

The Group I B conductive materials are the transition metals such as copper (Cu), silver (Ag), and gold (Au). Of the Group VIII B elements, the most effective are cobalt (Co), nickel (Ni), and palladium (Pd). Of the Group V B elements, tantalum (Ta) is the most effective. Of the Group VI B elements, the most effective are molybdenum (Mo) and tungsten (W). Preferred alloys are of NiW, NiTa, NiMo, CoW, CoTa, CoMo, PdW, PdTa, and PdMo.

Various metal deposition techniques can be used for the deposition of the above materials, such techniques include but are not limited to physical vapor deposition, chemical vapor deposition, electroless deposition, electroplating, ion-metal plasma (IMP), hollow cathode magnetron (HCM), or a combination thereof.

While different proportions have different degrees of effect, it has been found that optimal results may be obtained where the Group V B or VI B material is between 0.2% to 4% by weight percent of the Group VIII B material.

It is also feasible to deposit pure layers of the Group VIII B element Co, Ni, or Pd by a metal deposition technique, as described above, and implant the Group V B or Group VI B element W, Ta, or Mo into the pure layer.

Next, the conductive material 206 is deposited into second channel opening 106 and via opening 118 using a conventional metal deposition technique. Thereafter, a chemical mechanical polishing process is used to complete the conventional connection process similar to what was shown and described in FIG. 2.

In an alternate mode, the thin adhesion layer 208 is deposited in the second channel opening 106 and the cylindrical via opening 118, including along the walls of the second channel opening 106 and the cylindrical via opening 118, before the deposition of the barrier layer 204. The adhesion material is a pure Group VIII B element such as Co, Ni, or Pd, which are very low resistivity metals compared to conventional adhesion materials such as tantalum and titanium. The adhesion layer 208 is deposited using the above described deposition techniques.

It should be noted that the pure Group VIII B element of the adhesion layer 208 will also provide excellent barrier effectiveness with very low resistivity. It has been determined that alloying the pure element significantly increases the barrier effectiveness although there is an increase of 10% to 20% in the resistivity. However, the resistivity of the alloy is still much less than that of tantalum or titanium. At this point, it is judged that the trade-off favors the greater barrier effectiveness so the barrier layer 204 is an alloy rather than a single element. The same deposition processes mentioned above are used to deposit the adhesion layer 208.

While the best mode utilizes copper as the conductive material, it should be understood that the present invention is applicable to other conductive materials such as aluminum, tungsten, doped polysilicon, copper-base alloys, gold, gold-base alloys, silver, silver-base alloys, and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention. In addition, while the embodiments of the present inventions form a barrier layer in a channel opening and a via opening atop another conductive channel, it should be understood that the present invention is applicable to barrier/adhesion layers in a channel openings and/or a via openings atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A semiconductor comprising:

a semiconductor substrate;

a dielectric layer formed on a region of said semiconductor substrate;

an opening in said dielectric layer, said opening defined by walls of said dielectric layer and exposes a conductive area in the semiconductor;

a barrier layer on said dielectric layer in said opening, including along said walls, and in conductive contact with said conductive area, said barrier layer containing a first metal from Group VIII B combined with a second metal; and a conductive material in contact with said barrier layer, said conductive material substantially fills said opening.

2. The semiconductor as claimed in claim 1 wherein said second metal includes a Group V B element combined in said barrier layer.

3. The semiconductor as claimed in claim 1 wherein said second metal includes a Group VI B element combined in said barrier layer.

4. The semiconductor as claimed in claim 1 wherein said second metal includes between 0.2% to 4% of a Group V B element combined in said barrier layer.

5. The semiconductor as claimed in claim 1 wherein said second metal includes between 0.2% to 4% of a Group VI B element combined in said barrier layer.

6. The semiconductor as claimed in claim 1 wherein said conductive material is a material containing a Group I B element.

7. The semiconductor as claimed in claim 1 wherein said conductive material is a material selected from the group comprising aluminum, tungsten, doped polysilicon, copper-base alloys, gold, gold-base alloys, silver, silver-base alloys, and combinations thereof.

8. A semiconductor comprising:

a semiconductor substrate;

a dielectric layer formed on a region of said semiconductor substrate;

an opening in said dielectric layer, said opening defined by walls of said dielectric layer and exposes a portion of said region on said semiconductor substrate;

a barrier layer on said dielectric layer in said opening, including along said walls, said barrier layer containing therefore a first metal selected from a group consisting of cobalt, nickel, palladium and combinations thereof combined with a second metal; and a conductive material in contact with said barrier layer, said conductive material substantially fills said opening.

9. The semiconductor as claimed in claim 8 wherein said second metal includes a tantalum alloyed to said barrier layer.

10. The semiconductor as claimed in claim 8 wherein said second metal includes a metal alloyed with said barrier layer selected from the group comprising molybdenum and tungsten.

11. The semiconductor as claimed in claim 8 wherein said second metal includes between 0.2% to 4% of tantalum alloyed in said barrier layer.

12. The semiconductor as claimed in claim 8 wherein said second metal includes between 0.2% to 4% of a metal alloyed with said barrier layer selected from the group comprising molybdenum and tungsten.

13. The semiconductor as claimed in claim 8 wherein said conductive material is a material selected from the group comprising copper, silver, gold, and combinations thereof.

14. The semiconductor as claimed in claim 8 wherein said conductive material is a material selected from the group comprising aluminum, tungsten, doped polysilicon, copper-base alloys, gold, gold-base alloys, silver, silver-base alloys, and combinations thereof.

* * * * *